(12) United States Patent
Davis et al.

(10) Patent No.: US 11,728,248 B2
(45) Date of Patent: Aug. 15, 2023

(54) FULLY MOLDED SEMICONDUCTOR STRUCTURE WITH THROUGH SILICON VIA (TSV) VERTICAL INTERCONNECTS

(71) Applicant: Deca Technologies USA, Inc., Tempe, AZ (US)

(72) Inventors: Robin Davis, Vancouver, WA (US); Timothy L. Olson, Phoenix, AZ (US); Craig Bishop, Scottsdale, AZ (US); Clifford Sandstrom, Richfield, MN (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/842,491

(22) Filed: Jun. 16, 2022

(65) Prior Publication Data
US 2023/0005820 A1    Jan. 5, 2023

Related U.S. Application Data

(60) Provisional application No. 63/217,640, filed on Jul. 1, 2021.

(51) Int. Cl.
*H01L 23/48* (2006.01)
*H01L 25/065* (2023.01)
(Continued)

(52) U.S. Cl.
CPC .......... *H01L 23/481* (2013.01); *H01L 21/565* (2013.01); *H01L 23/5386* (2013.01);
(Continued)

(58) Field of Classification Search
CPC ............... H01L 23/481; H01L 23/5386; H01L 23/5389; H01L 23/49811; H01L 23/49833;
(Continued)

(56) References Cited

U.S. PATENT DOCUMENTS

| | | |
|---|---|---|
| 10,720,417 B2 | 7/2020 | Scanlan |
| 2010/0244208 A1* | 9/2010 | Pagaila ................... H01L 23/50 257/659 |

(Continued)

*Primary Examiner* — Kyoung Lee
*Assistant Examiner* — Christina A Sylvia
(74) *Attorney, Agent, or Firm* — Booth Udall Fuller, PLC; Bryce W. Burnham

(57) ABSTRACT

A method of making a semiconductor device may include providing a large semiconductor die comprising conductive interconnects with a first encapsulant disposed over four side surfaces of the large semiconductor die, over the active surface of the large semiconductor die, and around the conductive interconnects. A first build-up interconnect structure may be formed over the large semiconductor die and over the first encapsulant. Vertical conductive interconnects may be formed over the first build-up interconnect structure and around an embedded device mount site. An embedded device comprising through silicon vias (TSVs) may be disposed over the embedded device mount site. A second encapsulant may be disposed over the build-up structure, and around at least five sides of the embedded device. A second build-up structure may be formed disposed over the planar surface and configured to be electrically coupled to the TSVs of the embedded device and the vertical conductive interconnects.

20 Claims, 10 Drawing Sheets

(51) Int. Cl.
*H01L 23/538* (2006.01)
*H01L 21/56* (2006.01)
*H01L 23/00* (2006.01)
*H01L 25/16* (2023.01)
*H01L 23/498* (2006.01)

(52) U.S. Cl.
CPC .......... *H01L 23/5389* (2013.01); *H01L 24/16* (2013.01); *H01L 25/0652* (2013.01); *H01L 23/49811* (2013.01); *H01L 23/49833* (2013.01); *H01L 23/49838* (2013.01); *H01L 23/5385* (2013.01); *H01L 24/96* (2013.01); *H01L 25/16* (2013.01); *H01L 2224/16227* (2013.01); *H01L 2224/16238* (2013.01); *H01L 2924/182* (2013.01); *H01L 2924/37001* (2013.01)

(58) Field of Classification Search
CPC ........... H01L 23/49838; H01L 23/5385; H01L 24/16; H01L 24/96; H01L 25/0652; H01L 25/16; H01L 25/565; H01L 2224/16227; H01L 2224/16238; H01L 2924/182; H01L 2924/37001

See application file for complete search history.

(56) References Cited

U.S. PATENT DOCUMENTS

| | | |
|---|---|---|
| 2011/0183464 A1 | 7/2011 | Takahashi |
| 2012/0056312 A1 | 3/2012 | Pagaila |
| 2012/0104562 A1 | 5/2012 | Pagaila |
| 2012/0273959 A1 | 11/2012 | Park |
| 2012/0273960 A1 | 11/2012 | Park |
| 2013/0001762 A1 | 1/2013 | Chi |
| 2014/0264905 A1 | 9/2014 | Lee |
| 2015/0145128 A1* | 5/2015 | Pagaila ............... H01L 23/3121 257/737 |
| 2016/0218089 A1 | 7/2016 | Lee |
| 2016/0315071 A1* | 10/2016 | Zhai ....................... H01L 24/73 |
| 2017/0077022 A1 | 3/2017 | Scanlan |
| 2018/0061741 A1 | 3/2018 | Beyne |
| 2018/0061809 A1* | 3/2018 | Chiu ................. H01L 23/49541 |
| 2018/0108606 A1 | 4/2018 | Scanlan |
| 2018/0190514 A1 | 7/2018 | Baloglu |
| 2018/0330966 A1 | 11/2018 | Scanlan |
| 2019/0088621 A1* | 3/2019 | Yang ................... H01L 25/0657 |
| 2019/0244947 A1* | 8/2019 | Yu ........................... H01L 24/92 |
| 2020/0273829 A1 | 8/2020 | Hsu |
| 2020/0294938 A1* | 9/2020 | Jain ..................... H01L 23/5383 |
| 2020/0402941 A1 | 12/2020 | Olson |
| 2021/0020605 A1 | 1/2021 | Hiner |
| 2021/0090983 A1 | 3/2021 | Lin |
| 2021/0366873 A1* | 11/2021 | Gandhi ............... H01L 23/5389 |
| 2022/0028791 A1 | 1/2022 | Choi |
| 2022/0157740 A1 | 5/2022 | Verhaverbeke |
| 2022/0246532 A1 | 8/2022 | Sandstrom |

\* cited by examiner

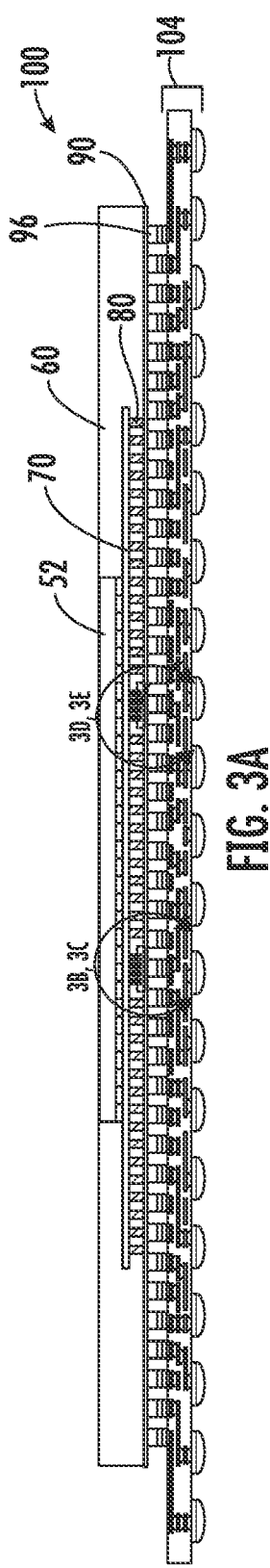
FIG. 3A
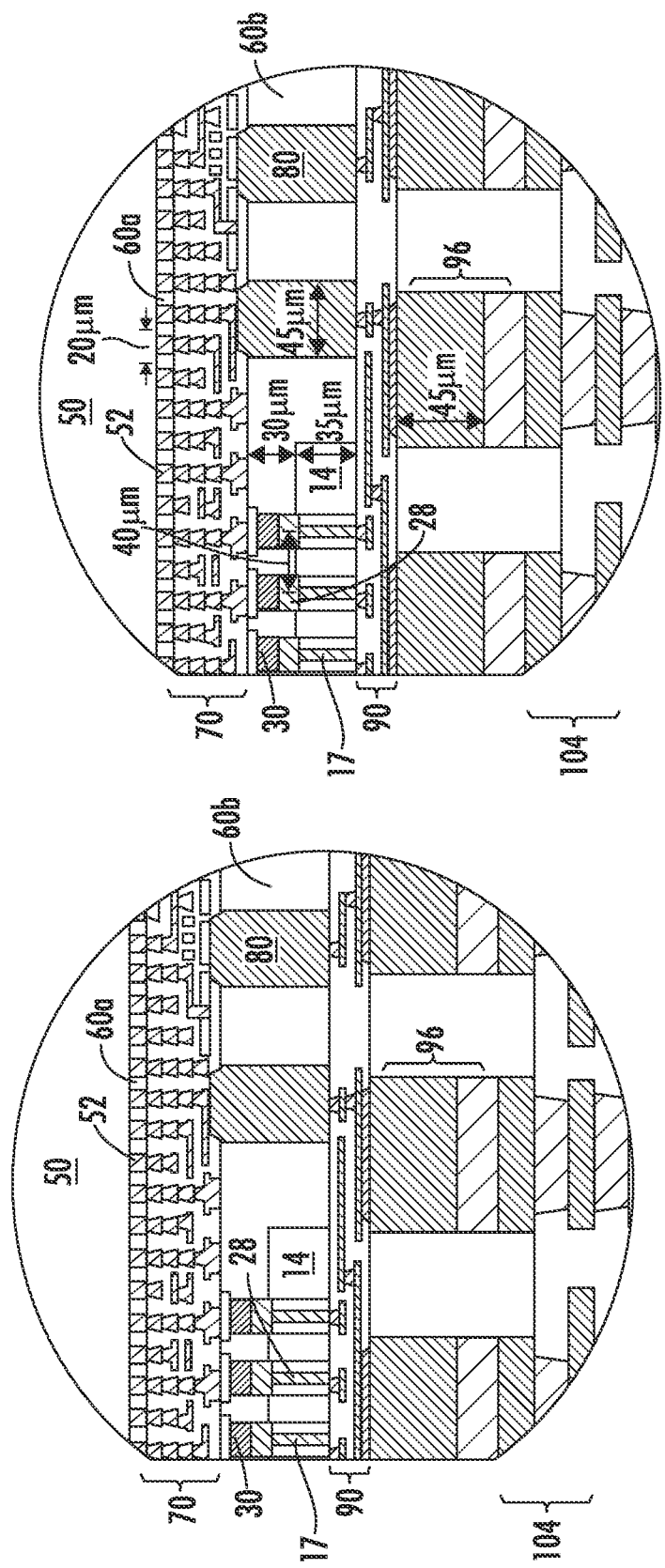
FIG. 3B
FIG. 3C

FULLY MOLDED SEMICONDUCTOR STRUCTURE WITH THROUGH SILICON VIA (TSV) VERTICAL INTERCONNECTS

CROSS-REFERENCE TO RELATED APPLICATIONS

This disclosure claims the benefit, including the filing date, of U.S. Provisional Patent No. 63/217,640, entitled "Stackable Fully Molded Semiconductor Structure with Through Silicon Via (TSV) Vertical Interconnects," which was filed on Jul. 1, 2021, the disclosure of which is hereby incorporated herein by this reference.

TECHNICAL FIELD

The disclosure relates to a fully molded semiconductor package and method of making the same, which includes through silicon vias (TSVs) through a fully molded embedded device to provide vertical electrical interconnects through the embedded device. The semiconductor device may further comprise a fully molded large semiconductor die disposed over the fully molded embedded device with TSVs.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, memories, analog to digital or digital to analog converters, power management and charged-coupled devices (CCDs) as well as MEMS devices including digital micro-mirror devices (DMDs).

Semiconductor devices perform a wide range of functions such as signal processing, high-speed calculations, transmitting and receiving electromagnetic signals, controlling electronic devices, storing information, and creating visual projections for displays. Semiconductor devices are found in many fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar, complementary metal oxide semiconductors, and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

An opportunity exists for improved semiconductor manufacturing. Accordingly, in an aspect of the disclosure, a method of making a semiconductor device, comprising disposing a large semiconductor die face up over a temporary carrier, the semiconductor die comprising conductive interconnects over an active surface of the semiconductor die. A first encapsulant may be disposed over four side surfaces of the large semiconductor die, over the active surface of the large semiconductor die, and around the conductive interconnects. The first encapsulant over an active surface of the semiconductor die may be planarized to create a planar surface comprising exposed ends of the conductive interconnects and exposed first encapsulant. A first build-up interconnect structure may be formed over the large semiconductor die and over the first encapsulant in a periphery of the semiconductor die. Vertical conductive interconnects may be formed over the first build-up interconnect structure and around an embedded device mount site. An embedded device may be disposed over the embedded device mount site. The embedded device may comprise through silicon vias (TSVs) and is disposed within a footprint of the large semiconductor die. A second encapsulant may be disposed over the build-up structure, and around at least five sides of the embedded device. The second encapsulant, the embedded device, the TSVs, and the vertical conductive interconnects may be planarized to form a planar surface. A second build-up structure may be formed so as to be disposed over the planar surface and configured to be electrically coupled to the TSVs of the embedded device and the vertical conductive interconnects.

The method of making a semiconductor device may further comprise the embedded device comprising an active device, a semiconductor die comprising an active surface, an IPD, or a passive device. The method may further comprise forming conductive bumps over the second build-up structure and configured to couple the semiconductor device with other devices. The conductive bumps may comprise one or more of an input electrical contact, an output electrical contact, an i/o contact, a bump, a solder ball, a solder bump, a BGA, a LGA, land pads, copper pillars, and copper pillars with solder. The method may further comprise mounting the conductive bumps of the semiconductor device to a printed circuit board. The method may further comprise disposing a first large semiconductor die face up over the temporary carrier; and subsequently disposing the large semiconductor die face up over the first large semiconductor die and the temporary carrier. The method may further comprise mounting the embedded device to the first build-up interconnect structure with solder. The method may further comprise mounting the embedded device to the first build-up interconnect structure with a solderless interconnect.

According to another an aspect of the disclosure, a method of making a semiconductor device may include providing a large semiconductor die comprising conductive interconnects with a first encapsulant disposed over four side surfaces of the large semiconductor die, over the active surface of the large semiconductor die, and around the conductive interconnects. A first build-up interconnect structure may be formed over the large semiconductor die and over the first encapsulant. Vertical conductive interconnects may be formed over the first build-up interconnect structure and around an embedded device mount site. An embedded device comprising through silicon vias (TSVs) may be disposed over the embedded device mount site. A second encapsulant may be disposed over the build-up structure, and around at least five sides of the embedded device. A second build-up structure may be formed disposed over the planar surface and configured to be electrically coupled to the TSVs of the embedded device and the vertical conductive interconnects.

The method of making a semiconductor device may further comprise the embedded device comprising an active device, a semiconductor die comprising an active surface, an integrated passive device (IPD), or a passive device. Conductive bumps may be formed over the second build-up structure and configured to couple the semiconductor device with other devices. The conductive bumps may comprise one or more of an input electrical contact, an output electrical contact, an i/o contact, a bump, a solder ball, a solder bump, a BGA, a LGA, land pads, copper pillars, and copper pillars with solder. The method may further comprise providing a first large semiconductor die with encapsulant disposed over at least 5 sides of the first large semiconductor die, forming a build-up interconnect structure over the first large semiconductor die and the encapsulant, and subsequently disposing the large semiconductor die face up over the first large semiconductor die and the build-up interconnect structure over the first large semiconductor die. The method may further comprise mounting the embedded device to the first build-up interconnect structure with solder. The method may further comprise mounting the embedded device to the first build-up interconnect structure with a solderless interconnect. The method may further comprise a first layer of vertical conductive interconnects stacked over a second layer of vertical conductive interconnects.

According to another an aspect of the disclosure a semiconductor device may comprise a large semiconductor die comprising conductive interconnects. A first encapsulant disposed over four side surfaces of the large semiconductor die, over the active surface of the large semiconductor die, and around the conductive interconnects. A first build-up interconnect structure may be disposed over the large semiconductor die and over the first encapsulant. Vertical conductive interconnects may be disposed over the first build-up interconnect structure and around an embedded device mount site. An embedded device may be disposed over the embedded device mount site, wherein the embedded device comprises TSVs. A second encapsulant may be disposed over the build-up structure, and around at least five sides of the embedded device. A second build-up structure may be disposed over the planar surface and configured to be electrically coupled to the TSVs of the embedded device and the vertical conductive interconnects.

The semiconductor device may further comprise the embedded device comprising an active device, a semiconductor die comprising an active surface, an integrated passive device (IPD), or a passive device. The semiconductor device may further comprise conductive bumps disposed over the second build-up structure and configured to couple the semiconductor device with other devices. The conductive bumps may comprise one or more of an input electrical contact, an output electrical contact, an i/o contact, a bump, a solder ball, a solder bump, a BGA, a LGA, land pads, copper pillars, and copper pillars with solder. A first large semiconductor die may be disposed over the large semiconductor die. The embedded device may be coupled to the first build-up interconnect structure with solder. The embedded device may be coupled to the first build-up interconnect structure with a solderless interconnect. A first layer of vertical conductive interconnects may be stacked over a second layer of vertical conductive interconnects.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . .," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 3A-3E illustrate additional views of an aspect of the fully molded semiconductor package.

DETAILED DESCRIPTION

Figure 1A:
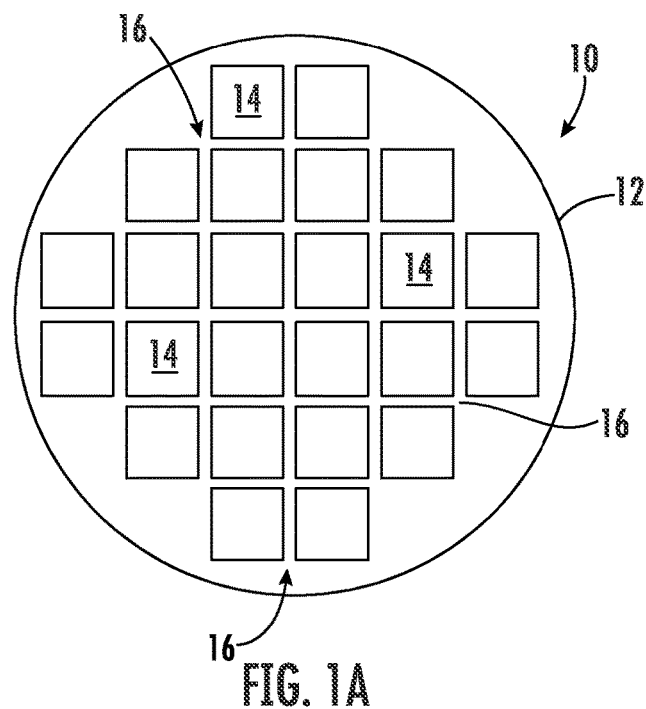
FIGS. 1A-1D illustrate the formation of an embedded device (e.g., peripherals or other passive or active devices) comprising TSVs that will be embedded into an interposer module.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning redistribution layers (RDLs), under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process, dry etch plasma dicing process, or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance. The chiplet approach also allows for heterogeneous integration, where devices built by different front-end processes can be integrated into a composite package.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIG. 1A shows a plan view of a semiconductor wafer or native wafer 10 with a base substrate material 12, such as, without limitation, silicon, germanium, gallium arsenide, gallium nitride, indium phosphide, or silicon carbide, for structural support. A plurality of embedded components, components, or semiconductor die 14 can be formed on wafer 10 separated by a non-active, inter-die wafer area or saw street 16 as described above. The embedded components 14 may include an active device, a semiconductor die comprising an active surface formed at the first surface, an integrated passive device (IPD), an IPD die, a bridge die with conductive interconnects, or a passive device. The saw street 16 can provide cutting areas to singulate the semiconductor wafer 10 into the individual components 14.

Figure 1B:
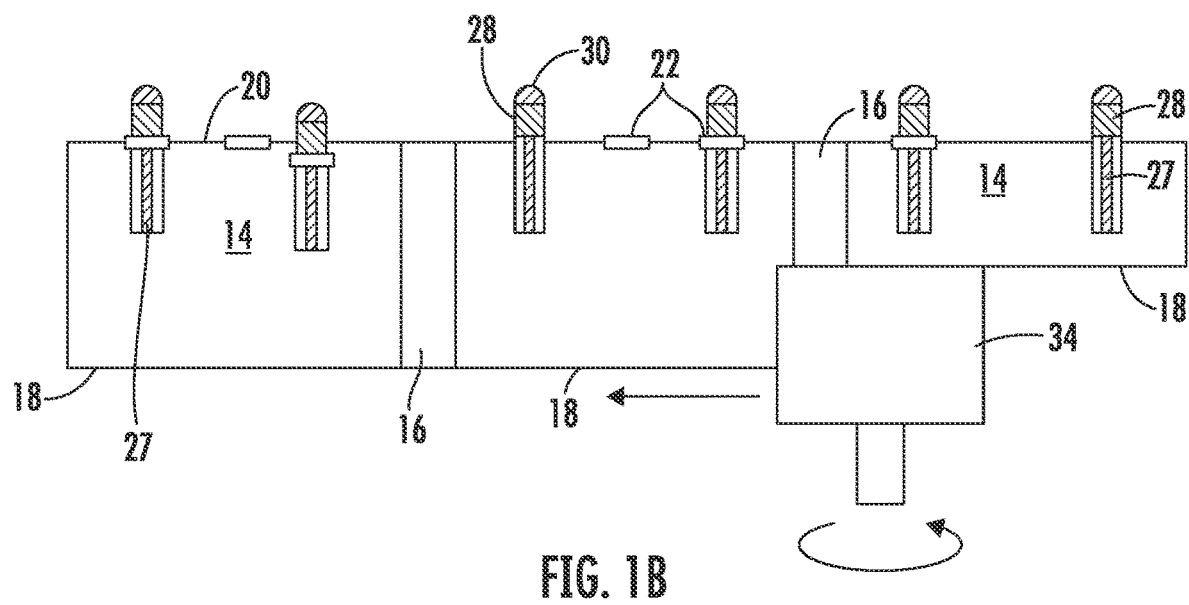

FIG. 1B shows a cross-sectional profile view of a plurality of components 14 from the native wafer 10, show in the plan view FIG. 1A.

Each of the components 14 comprises a backside or back surface 18 and an active surface 20 opposite the backside 18. Active surface 20 may contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Components 14 may also contain IPDs such as inductors, capacitors, and resistors, for power management, RF signal processing, clocking or other functions and Through Silicon Vias (TSV) 27. The TSVs 27 will extend from the active surface to the backside of the component 14 when complete, which will include removing any excess wafer material remaining from the TSVs during manufacture to expose the backside for electrical connection. The TSV 27 extends through the component 14 from the first surface 20 to the second surface 18 to provide through vertical interconnection. The TSVs may be exposed either at an initial backgrinding or material removal phase, such as at the time of the backgrinding shown in FIG. 1B, while in other instances the TSVs 18X may be exposed at a subsequent griding of removal process, such as is shown in FIG. 2D.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 can be, or operate as, contact pads or bond pads electrically coupled or connected to the circuits on active surface 20. Conductive layer 22 can be formed as contact pads disposed side-by-side a first distance from the edge of components 14, as shown in FIG. 1B. Conductive layer 22 can also be formed as contact pads that are offset in multiple rows such that a first row of contact pads is disposed a first distance from the edge of the die, and a second row of contact pads alternating with the first row is disposed a second distance from the edge of the die. Additionally, conductive layer 22 can be formed as contact pads that are arranged as a full array of pads distributed over the active area of the semiconductor die or chip. In some instances, the contact pads can be arranged in an irregular or asymmetrical array with differing or various spacing among the contact pads including the use of RDL. Additionally, conductive layer 22 can be formed to contact the TSV 27.

FIG. 1B may also include an optional insulating or passivation layer 26 conformally applied over active surface 20 and over conductive layer 22. Insulating layer 26 can include one or more layers that are applied using PVD, CVD, screen printing, slit or slot die coating, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, components 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B also shows a first electrical interconnect structure, conductive bump, conductive interconnect, or electrical interconnect structure 28 that can be formed as columns, pillars, posts, thick RDLs, bumps, or studs that are formed of copper or other suitable conductive material, which are disposed over, and coupled or connected to, TSV 27. Electrical interconnect structures 28 can be formed directly over TSV on conductive layer 22 using patterning and metal deposition processes such as printing, PVD, CVD, sputtering, electrolytic plating, electroless plating, metal evaporation, metal sputtering, or other suitable metal deposition process. Electrical interconnect structures 28 can be one or more layers of Al, Cu, Sn, Ni, Au, Ag, palladium (Pd), or other suitable electrically conductive material and can include one or more layers. In some embodiments, electrical interconnect structures 28 have a SnAg bump on top formed by plating. In some embodiments, electrical interconnect structures 28 can be formed by depositing a photoresist layer over the components 14 and conductive layer 22 while the components 14 are part of the semiconductor wafer 10. A portion of the photoresist layer can be exposed and removed by an etching development process, and the electrical interconnect structures 28 can be formed as copper pillars in the removed portion of the photoresist and over conductive layer 22 using a selective plating process. The photoresist layer can be removed leaving electrical interconnect structures 28 that provide for subsequent mechanical and electrical interconnection and a standoff with respect to active surface 20.

FIG. 1B also shows the semiconductor wafer 10 can undergo an optional grinding operation with a grinder 34 to planarize the surface and reduce a thickness of the semiconductor wafer 10. A chemical etch can also be used to remove and planarize a portion of the semiconductor wafer 10.

Figure 1C:
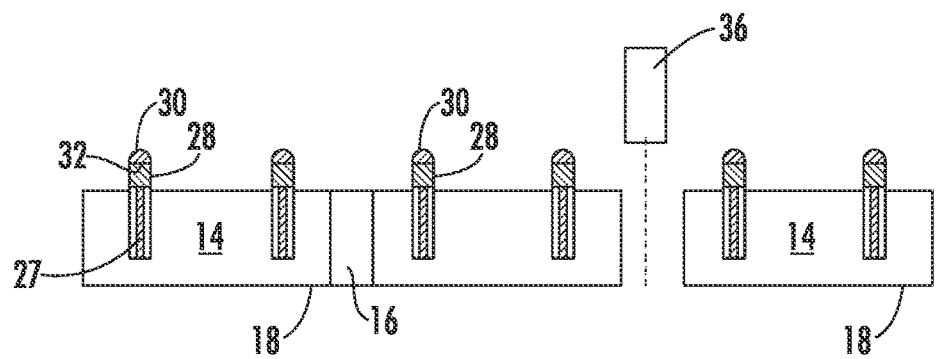
Figure 1D:
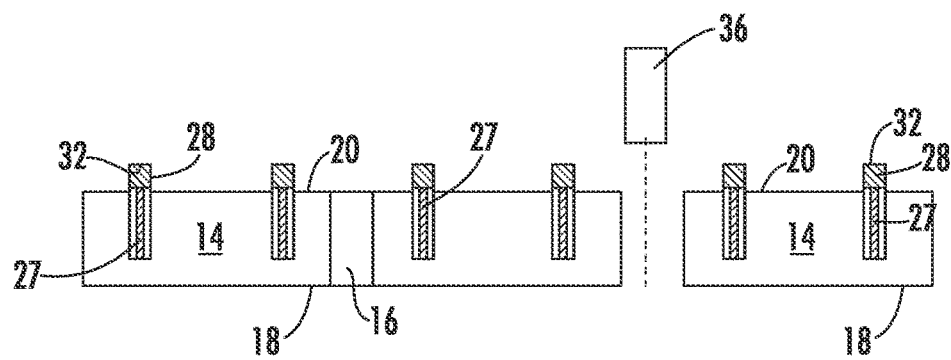

FIGS. 1C and 1D show semiconductor wafer 10 can be singulated through gaps or saw streets 16 using laser grooving, a saw blade, dry etch plasma dicing process, or laser cutting tool 36, or both thereof to singulate the semiconductor wafer 10 into individual components 14 with electrical interconnect structures 28. The components 14 can then be used as part of a subsequently formed semiconductor component package as discussed in greater detail below with respect to FIGS. 2A-2P. FIGS. 1C and 1D differ by the inclusion or exclusion of a solder bump or bump 30 on an end or tip 32 of the conductive interconnect 28. As illustrated in FIG. 1C, in some instances the solder bump 30 may be included for subsequent flip chip mounting. As illustrated in FIG. 1D, in some instances the solder bump 30 may be omitted and subsequent flip chip mounting may be accomplished without solder.

Figure 2A:
FIGS. 2A-2P illustrate a fully molded semiconductor package including TSVs through a fully molded embedded device with a fully molded large semiconductor die disposed over the fully molded embedded device, and method of making the same.

FIG. 2A illustrates providing a carrier, substrate, or temporary carrier 40, on which subsequent processing of the semiconductor devices, semiconductor component packages, or fully-molded interposer module or packages 100 can occur, as described in greater detail herein.

Carrier 40 may be a temporary or sacrificial carrier or substrate, and in other instances may be or a reusable carrier or substrate. The carrier 40 can contain one or more base materials formed in one or more layers, which may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. When a UV release is used with a temporary carrier 40, the carrier 40 may comprise one or more transparent or translucent materials, such as glass. When a thermal release is used with a temporary carrier 40, the carrier 40 may comprise opaque materials. The carrier 40 can be circular, square, rectangular, or other suitable or desirable shape and can include any desirable size, such as a size equal to, similar to, or slightly larger or smaller than a reconstituted wafer or panel that is subsequently formed on or over the carrier 40. In some instances, a diameter, length, or width of the temporary carrier can be equal to, or about, 200 millimeters (mm), 300 mm, 600 mm or more.

When a temporary carrier 40 is used, an optional release layer, interface layer or double-sided tape 44 can be formed over carrier 40 as a temporary adhesive bonding film or etch-stop layer. The release layer 40 may be a film or laminate, and may also be applied by slit or slot die coating, spin coating, or other suitable process. The temporary carrier can be subsequently removed by strip etching, chemical etching, mechanical peel-off, CMP, plasma etching, thermal, light releasing process, mechanical grinding, thermal bake, laser scanning, UV light, or wet stripping. While the release layer 44 is shown in FIG. 2A, for convenience and simplicity, the optional release layer 44 has been omitted from subsequent FIGs., although a person of ordinary skill will understand that the release layer 44 can remain and be present in processing shown in the other FIGs.

A large semiconductor die 50 may be disposed or mounted face up over the temporary carrier 40. The semiconductor die 50 may comprise conductive interconnects 52 disposed over, and coupled to, an active surface 54 of the semiconductor die 50. The semiconductor die 50 may be made in a manner or fashion similar to semiconductor die 14, but may be larger. The semiconductor die 50 may be a system on chip (SoC), chiplet, memory device, microprocessor, graphics processor, artificial intelligence (AI) processor, networking processor, or analog device, clock, or other semiconductor device.

When desirable, a die attach film (DAF) 58 may be placed on a back surface of the large semiconductor die 50 at, or before, mounting the backside of the large semiconductor die 50 to the temporary carrier 40. In some instances, a layer of an encapsulant or mold compound 60 may be formed over the carrier 40 as a base layer of encapsulant 60a before mounting the large semiconductor die 50 to the carrier 40. The encapsulant 60 (including base layer of encapsulant 60a or any subsequently formed layer of encapsulant, e.g. 60a, 60b, 60c, 60n, or 60n+1) can be deposited over the carrier 40 using a paste printing, compression molding, transfer molding, liquid encapsulant molding, lamination, vacuum lamination, spin coating, slit or slot die coating, or other suitable applicator. The encapsulant 60 can be a polymer composite material, such as epoxy resin with filler, epoxy acrylate with filler, or polymer with proper filler. As such, after encapsulation of the large semiconductor die 50 (as shown and described with respect to FIG. 2B), all surfaces of the large semiconductor die 50 can be covered with encapsulant 60 or encapsulant and DAF. Alternatively, the backside or back surface of the large semiconductor die 50 can be exposed from the encapsulant 60.

Figure 2B:
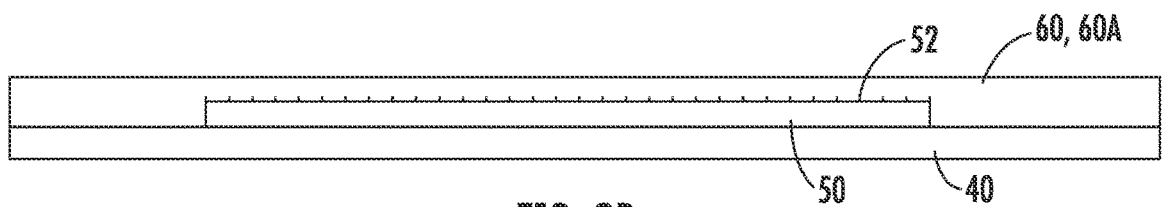

FIG. 2B illustrates that after mounting the large semiconductor die 50 to the carrier 40, additional encapsulant 60, such as a first encapsulant 60b can be deposited around the large semiconductor die 50 using a paste printing, compression molding, transfer molding, liquid encapsulant molding, lamination, vacuum lamination, spin coating, slit or slot die coating, or other suitable applicator. The large semiconductor die 50 can be embedded in encapsulant 60b, which can be non-conductive and environmentally protect the large semiconductor die 50v from external elements and contaminants. The large semiconductor die 50 can be formed over, adjacent to, with intervening members, materials, or layers, or may directly contacting all lateral sides of the large semiconductor die 50 (such as four sides), as well as be formed over the active surface 20 ($5^{th}$ side) of the large semiconductor die 50 (with or without an intervening RDL). An intervening members, materials, or layers, disposed between the large semiconductor die 50 and the encapsulant 60, may include, e.g., polyimide or other desirable material. The mold compound 56 can also be formed around and directly contact the sides of the conductive interconnects 52.

Figure 2C:
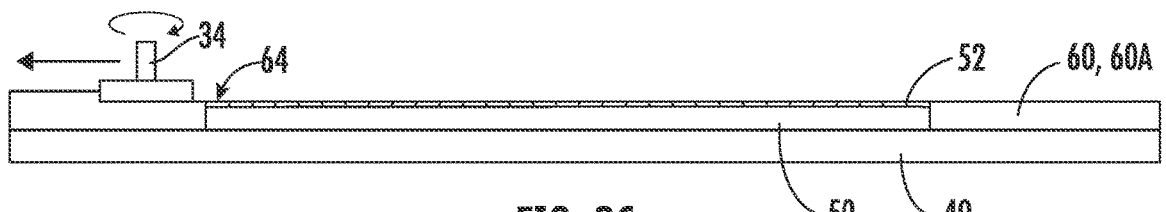
Figure 2D:
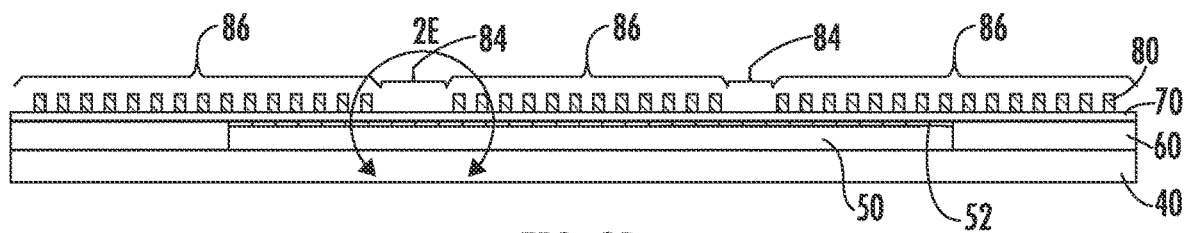

FIG. 2C illustrates the first encapsulant 60b and the conductive interconnects 52 of the large semiconductor die 50 can undergo a grinding operation with a grinder 34 to expose the conductive interconnects 52, planarize the surface and reduce a thickness of the first encapsulant 60b and form a planar surface 64. A chemical etch can also be used to form or finish the planar surface 64. Planarizing the first encapsulant 60b over an active surface 54 of the large semiconductor die 50 creates the planar surface 64, wherein the planar surface 64 comprises exposed ends 66 of the conductive interconnects 52 and exposed first encapsulant.

FIG. 2D illustrates forming a first build-up interconnect structure 70 over the planar surface 64, over the large semiconductor die 50, and over the first encapsulant 60b in a periphery 68 of the large semiconductor die 50. The build-up interconnect structure 70 may be formed to electrically connect, and provide routing with respect to, conductive interconnects 52 and the large semiconductor die 50.

The build-up interconnect structure 70 comprises one more layers of alternating conductive layers and insulating layers, such as 2-8 alternating conductive or routing layers. However, a person of ordinary skill in the art will appreciate that fewer layers or more layers can be used depending on the configuration and design of the semiconductor device 100. The build-up interconnect structure 70 can optionally comprise one or more insulating or passivation layers 72 formed or disposed over the planar surface 64. The first (and subsequent) insulating layers 72 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 72 can be formed using PVD, CVD, printing, spin coating, slit or slot die coating, spray coating, sintering or thermal oxidation. Openings or conductive vias can be formed through the insulating layers 72 over the conductive interconnects 52 and for other desired electrical connections. In other words, conductive vias or vertical electrical interconnects may be formed as part of the build-up interconnect structure 70 (and more specifically, e.g., the first conductive layer 74 as described below) may form electrical interconnects through the insulating layers 72.

The first conductive layer 74 can be formed over the planar surface 64, and over a first insulating layer 72, as a first RDL layer to extend through the openings in the first insulating layer 72, or to otherwise electrically connect with the conductive interconnects 52. In some instances, the first conductive layer 74 may be formed directly on the planar surface 64. Conductive layer 74 can be one or more layers of Al, Cu, Sn, Ni, Au, Ag, or other suitable electrically conductive material formed using a patterning and metal deposition process such as sputtering, electrolytic plating, and electroless plating, or other suitable process. A desired number of alternating insulating layers 72 and conductive layers 74 can be built for form the desired routing, according to the configuration and design of the semiconductor device 100.

Next, vertical conductive interconnects 80 can be formed over the first build-up interconnect structure 70 and around embedded device mount sites or die attach areas 84. The embedded device mount sites 84 may be spaced or disposed across a surface of the planar surface 64, according to a design and configuration of the final semiconductor devices 100, to provide a peripheral area or space 86. The peripheral area 86 can partially or completely surround the embedded device mount sites 84 to provide space for subsequent vertical interconnections.

The vertical conductive interconnects 80 may be formed with a seed layer and a resist or photoresist layer. The seed layer may be formed over the build-up interconnect structure 70. The seed layer can be one or more layers of Al, Cu, Sn, Ni, Au, Ag, Titanium (Ti), Tungsten (W) or other suitable electrically conductive material. In some instances, the seed layer will be, or may include, Ti/Cu, TiW/Cu, W/Cu or a coupling agent/Cu. The formation, placement, or deposition of the seed layer can be with PVD, CVD, electrolytic plating, electroless plating, or other suitable process. The seed layer can be deposited by sputtering, electroless plating, or by depositing laminated foil, such as Cu foil, combined with electroless plating.

A resist layer or photosensitive layer may be formed or deposited over the seed layer and the build-up interconnect structure 70. After formation of the resist layer, the resist layer can then be exposed and developed to form openings in the resist layer. In some instances, more than one photoresist layer may be used. The openings may be formed in the photoresist, and can be positioned over, or within a footprint of, the peripheral area 86. A plurality of vertical conductive interconnects 80 may be formed within the resist layer as columns, pillars, posts, bumps, or studs that are formed of copper or other suitable conductive material.

The vertical conductive interconnects 80 can be formed using patterning and metal deposition processes such as printing, PVD, CVD, sputtering, electrolytic plating, electroless plating, metal evaporation, metal sputtering, or other process. Vertical conductive interconnects 80 can be one or more layers of Al, Cu, Sn, Ni, Au, Ag, Pd, solder, or other suitable electrically conductive material suitable metal deposition process. When the vertical conductive interconnects 80 are formed by plating, the seed layer can be one or more layers of the vertical conductive interconnects 80.

After formation of the vertical conductive interconnects 80, the resist layer can be removed, such as by a stripping process, leaving vertical conductive interconnects 80 in the peripheral area 86 around the embedded device mount sites 84, as illustrated in FIG. 2D. Vertical conductive interconnects 80 can include a height H1 in a range of 25-300 µm, or a height thereabout. As used herein, "thereabout," "about," or "substantially" means a percent difference in a range of 0-5%, 1-10%, 1-20%, or 1-30% (review height specs). For thin applications.

Alternatively, preformed vertical conductive interconnects 80 may be formed away from the planar surface 64, may be placed over the planar surface 64 after formation, such as with a pick and place operation. In some instances, the vertical conductive interconnects 80 may be part of larger frame (whether integrally or separately formed with the vertical conductive interconnects 80) with connecting members to maintain a desired spacing or position of the vertical conductive interconnects 80. The vertical conductive interconnects 80 may be in contact with, surrounded by, or encapsulated or molded with a single encapsulant or mold compound 60 at a single step, as shown, e.g., in FIG. 2I.

Figure 2E:
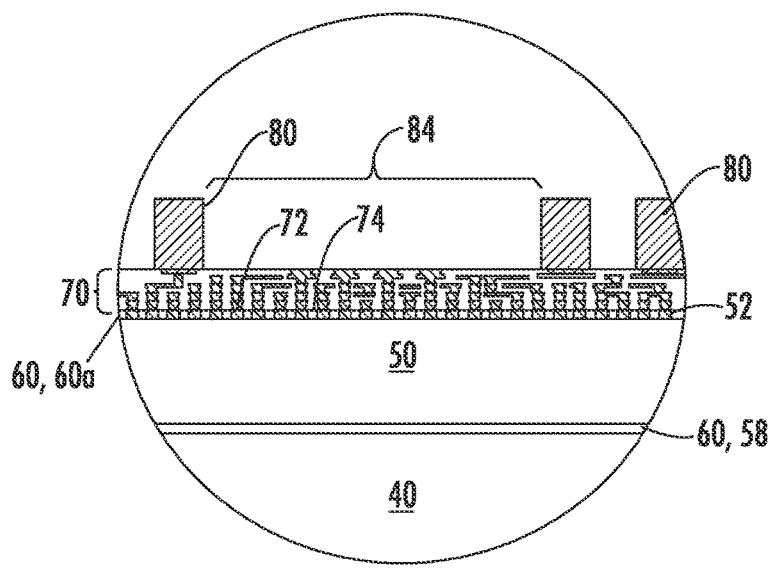
Figure 2F:
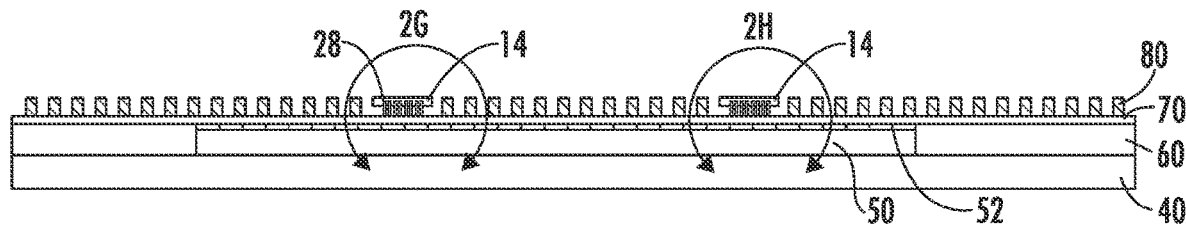

FIG. 2E illustrates a close-up profile view of the embedded device mount sites 84 illustrated in FIG. 2D. After removal of the resist layer, the embedded device mount sites 84 can be exposed and ready to receive the embedded components 14 with TSVs. FIG. 2F illustrates the orientation of the embedded components 14 may be face down with the conductive interconnects 28 (with or without solder bump 30) oriented towards the build-up interconnect structure 70, to which the embedded components 14 are mounted. The embedded components 14 may be positioned within a footprint of the large semiconductor die 50. On the left side of FIG. 2F is shown embedded components 14 with solder bump 30, and on the right side of FIG. 2F is shown embedded components 14 without solder bumps 30.

Figure 2G:
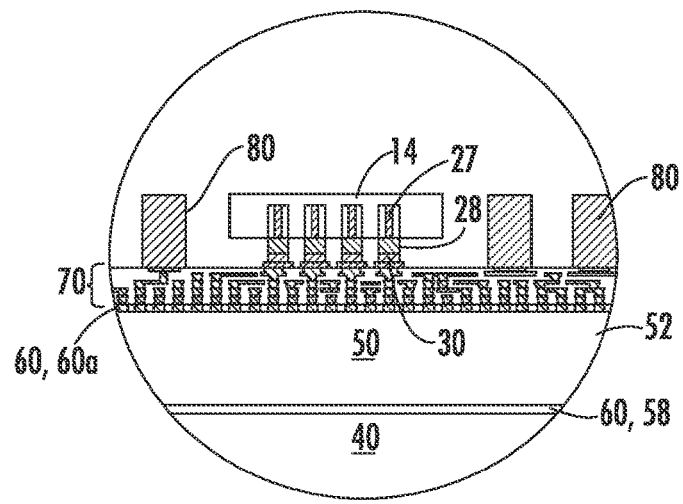

FIG. 2G illustrates a close-up profile view of the embedded device mount site 84 illustrated on the left side of FIG. 2F, in which is shown an embedded device 14 with solder bumps 30 mounted to the build-up interconnect structure 70.

Figure 2H:
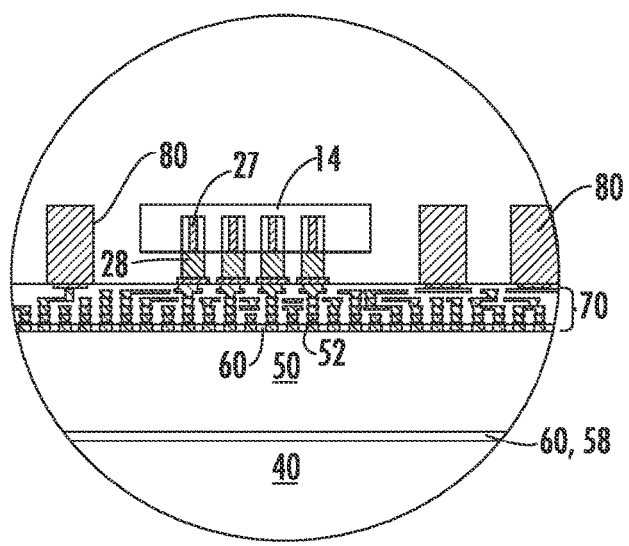

FIG. 2H illustrates a close-up profile view of the embedded device mount site 84 illustrated on the right side of FIG. 2F, in which is shown an embedded device 14 without solder mounted to the build-up interconnect structure 70. While FIG. 2F shows two different mounting approaches, with and without solder, generally a single approach will be used in a package, as will be appreciated by a POSA.

Figure 2I:

FIG. 2I illustrates disposing encapsulant 60, or a second encapsulant 60c, over the build-up structure 70, and around at least five sides of the embedded device 14, and around vertical conductive interconnects 80.

The encapsulant 60, or a second encapsulant 60c can optionally undergo a curing process or post mold cure (PMC) to cure the encapsulant 60. In some instances, a top surface, front surface, or first surface 62 of the encapsulant 60b can be substantially coplanar with exposed ends 66 of the conductive interconnects 52 to form a planar surface 88. Alternatively, the top surface 62 of the encapsulant 60 can be over, offset, or vertically separated from ends of the conductive interconnects 52, such that the ends of the conductive interconnects 52 are exposed with respect to the encapsulant 60 after the encapsulant 60 undergoes a grinding operation.

Figure 2J:
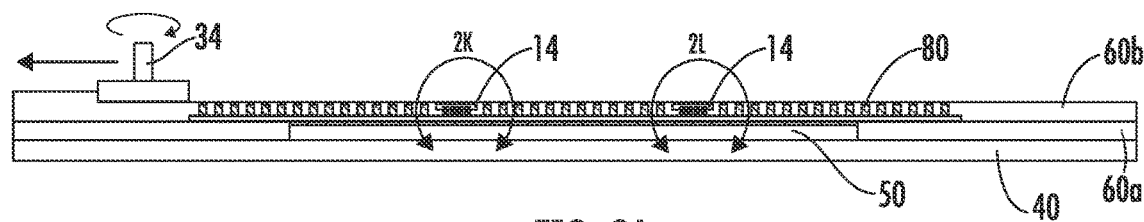

FIG. 2J illustrates the encapsulant 60 can undergo a grinding operation with grinder 34 to planarize the top surface, front surface, or first surface 62 of the encapsulant 60b and to reduce a thickness of the encapsulant 60, and to form the planar surface 88. A chemical etch can also be used to remove smear, such as Cu smear, from the encapsulant, EMC, or mold compound 60 that results from the grinding. The chemical etch may cause the metal or Cu of the conductive interconnects 28 and the vertical conductive interconnects 80 to be recessed (or slightly non-planar) with respect to the planar surface 88 of the encapsulant 60, such as in a range of about 50 to 500 nanometers, but will still be referred to as planar for ease of description. In other words, the etch may produce some minor non-planarity, which still allows for electrical connection among embedded device 14, large semiconductor die 50, vertical conductive interconnects 80, build-up interconnect structure 70. And a subsequently formed redistribution layer or build-up interconnect structure 90.

Figures 2K, 2L:
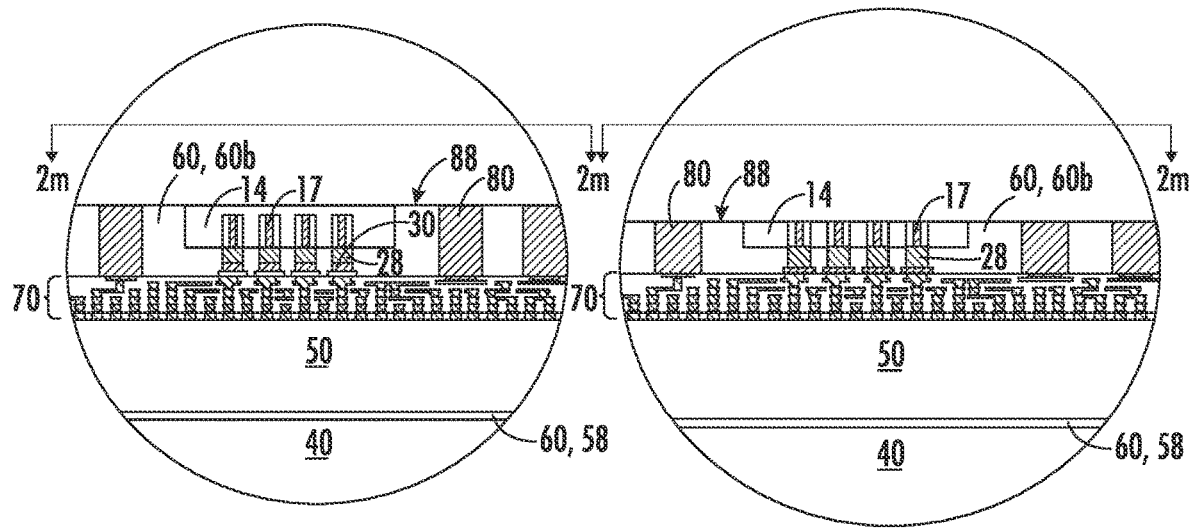

FIG. 2K illustrates a close-up profile view of embedded device 14 with solder bumps 30 mounted to the build-up interconnect structure 70 and covered in encapsulant 60c, as illustrated on the left side of FIG. 2J.

FIG. 2L illustrates a close-up profile view of embedded device 14 without solder or with solderless interconnects mounted to the build-up interconnect structure 70 and covered in encapsulant 60c, as illustrated on the right side of FIG. 2J. While FIG. 2J shows two different mounting approaches, with and without solder, generally a single approach will be used in a package, as will be appreciated by a POSA.

Figure 2M:
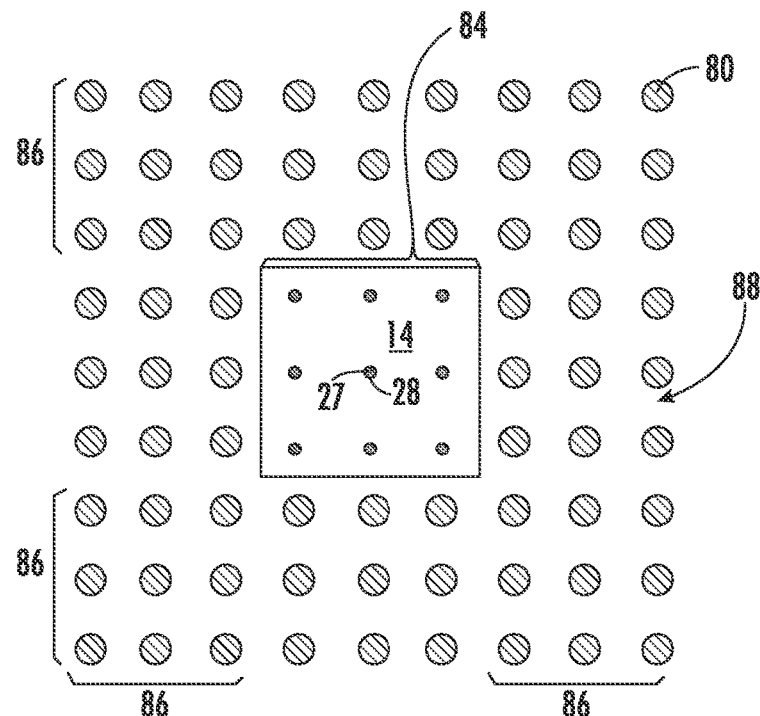

FIG. 2M illustrates an enlarged close-up top view or plan view of a portion of the embedded device 14 and the surrounding conductive interconnects 52 and encapsulant 60c shown in a view perpendicular to that of FIGS. 2K and 2L. FIG. 2M shows that the conductive interconnects 52 can be formed within, and extend intermittently across, the peripheral area 86 and surround the embedded device mount sites 84 without being formed within the embedded device mount sites 84.

Figure 2N:
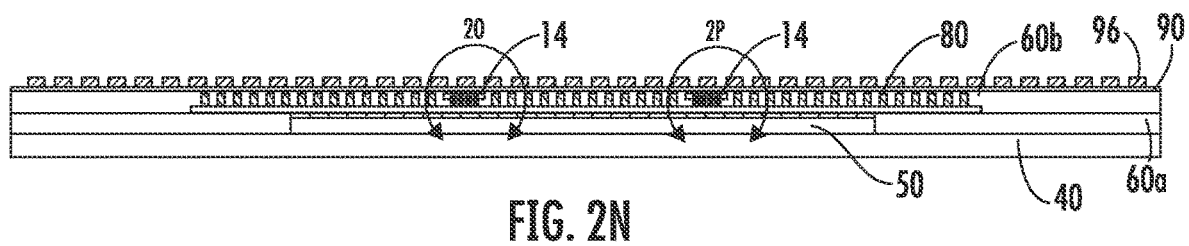

FIG. 2N illustrates a side profile view of forming a second build-up structure 90 disposed over the planar surface 88 and configured to be electrically coupled to the TSVs 27 of the embedded device 14 and the vertical conductive interconnects 80. The build-up interconnect structure 90, like the build-up interconnect structure 70, comprises one more layers of alternating conductive layers and insulating layers, such as 2-8 alternating conductive or routing layers. However, a person of ordinary skill in the art will appreciate that fewer layers or more layers can be used depending on the configuration and design of the semiconductor device 100. The build-up interconnect structure 90 can optionally comprise one or more insulating or passivation layers 92 formed or disposed over the second planar surface 88. The first (and subsequent) insulating layers 92 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 92 can be formed using PVD, CVD, printing, spin coating, slit or slot die coating, spray coating, sintering or thermal oxidation. Openings or conductive vias can be formed through the insulating layers 92, over the TSVs 27, and over the vertical conductive interconnects 80 and for other desired electrical connections. In other words, conductive vias or vertical electrical interconnects may be formed as part of the build-up interconnect structure 90 (and more specifically, e.g., the first conductive layer 94 as described below) may form electrical interconnects through the insulating layers 92.

The first conductive layer 94 can be formed over the second planar surface 88, and over a first insulating layer 92, as a first RDL layer to extend through the openings in the first insulating layer 92, or to otherwise electrically connect with the TSVs 27, and over the vertical conductive interconnects 80. In some instances, the first conductive layer 94 may be formed directly on the planar surface 88. Conductive layer 94 can be one or more layers of Al, Cu, Sn, Ni, Au, Ag, or other suitable electrically conductive material formed using a patterning and metal deposition process such as sputtering, electrolytic plating, and electroless plating, or other suitable process. A desired number of alternating insulating layers 92 and conductive layers 94 can be built for form the desired routing, according to the configuration and design of the semiconductor device 100. Bumps, conductive bumps, balls, or interconnect structures 96 can be formed on or coupled to the build-up interconnect structure 90.

The bumps 96 can be configured to couple the semiconductor device 100 with other devices, such as mounting the conductive bumps 96 of the semiconductor device 100 to a printed circuit board 104. Wherein the conductive bumps 96 comprise one or more of an input electrical contact, an output electrical contact, an i/o contact, a bump, a solder ball, a solder bump, a BGA, a LGA, land pads, copper pillars, and copper pillars with solder. The bumps 96 can be formed by depositing an electrically conductive bump material over the surface to which they will be attached using an evaporation, electrolytic plating, electroless plating, ball drop, or screen-printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded using a suitable attachment or bonding process. In one embodiment, the bump material is reflowed by heating the material above its melting point to form spherical balls or bumps 96. In some applications, bumps 96 are reflowed a second time to improve electrical contact to the build-up interconnect structure 90. The bumps 96 can also be compression bonded or thermocompression bonded. Bumps 96 represent one type of interconnect structure that can be formed, and other desirable structures, such as conductive paste, stud bump, micro bump, or other electrical interconnects may also be used as desired.

As illustrated in FIG. 2N, with the second build-up structure 90 and the bumps 96, a final semiconductor device, semiconductor component package, or fully-molded interposer module or package 100 may be formed.

Figure 2O:
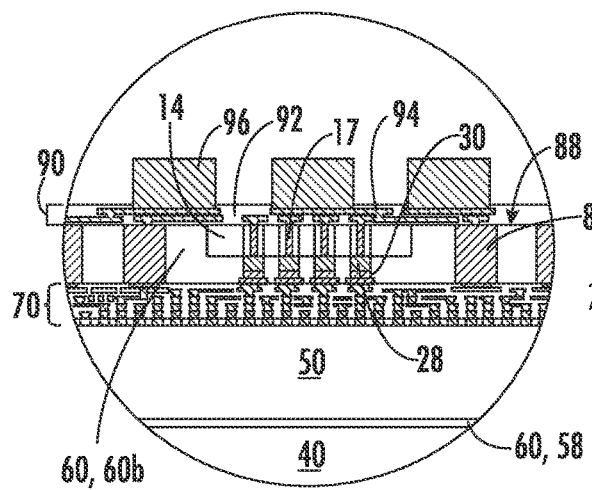

FIG. 2O illustrates a close-up profile view from the left side of FIG. 2N, showing embedded device 14 with solder bumps 30 mounted to the build-up interconnect structure 70 and covered in encapsulant 60.

Figure 2P:
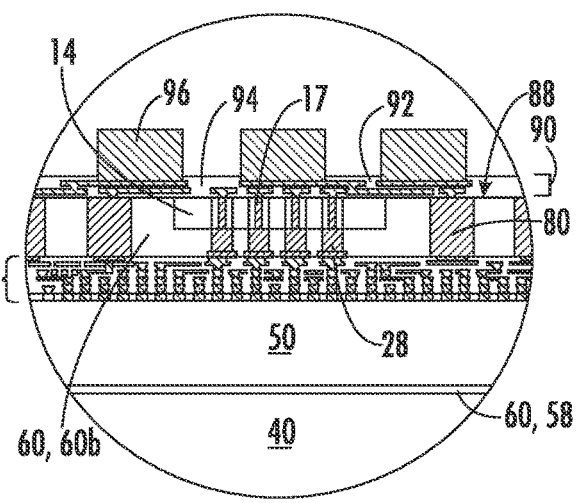

FIG. 2P illustrates a close-up profile view from the right side of FIG. 2N, showing the embedded device 14 without solder or with solderless interconnects mounted to the build-up interconnect structure 70 and covered in encapsulant 60c. While FIG. 2N shows two different mounting approaches, with and without solder, generally a single approach will be used in a package, as will be appreciated by a POSA.

FIGS. 3A-3E, continuing from FIGS. 2N-2P, illustrate semiconductor device 100 after the removal of carrier 40. The carrier 40 can be removed, e.g., by grinding the carrier 40, by exposing UV release tape 44 to UV radiation separate the UV tape 44 from the glass substrate 40, by thermal release, by laser ablation, or other suitable method. After removal of the carrier 40, the semiconductor device 100 can also undergo an etching process, such as a wet etch, to clean the surface of the large semiconductor die 50 (when exposed), and the encapsulant 60.

FIG. 3A also differs from FIG. 2N by the device 100 being flipped over with the large semiconductor die 50 being oriented face down rather than face up. In FIG. 3A, semiconductor device 100 is further shown coupled to a printed circuit board (PCB) or substrate 104 with bumps 96. FIG. 3A shows the build-up interconnect 70 with smaller horizontal reach or footprint than build-up interconnect structure 90. However, in some instances the horizontal reach or footprint of the build-up interconnect structure 70 can be as large as that of the build-up interconnect structure 90 and extend across and entire surface or most of the surface of the base layer of encapsulant 60a. As indicated in FIG. 2A, when desirable a DAF may be placed on a back surface of the large semiconductor die 50 at, or before, mounting the backside of the large semiconductor die 50 to the temporary carrier 40. As such, after encapsulation of the large semiconductor die 50 all surfaces of the large semiconductor die 50 can be covered. Alternatively, the backside or back surface of the large semiconductor die 50 can be exposed from the encapsulant 60.

FIG. 3B illustrates a close-up profile view from the left side of FIG. 2N, showing embedded device 14 with solder bumps 30 mounted to the build-up interconnect structure 70 and covered in encapsulant 60c. FIG. 3B differs from FIG. 2O by reversing or flipping the vertical orientation of the package, in keeping with the orientation of FIG. 3A, and further differs from FIG. 2O by the removal of the temporary carrier 40.

FIG. 3C illustrates the structure shown in FIG. 3B, but with exemplary dimensions that may be used in forming the semiconductor device 100. A pitch of the conductive interconnects 52 of the large semiconductor die 50 may be about 20 μm. A pitch of the TSVs 27 within the embedded device 14 may be about 40 μm. A height of the embedded device 14 may be about 35 μm. A height of the encapsulant 60b over the embedded device 14 and between the embedded device and the first build-up interconnect structure 70 may be about 30 μm. A diameter of the vertical conductive interconnects 80 may be about 45 μm. A height of the bumps 96, or a copper portion of the bumps 96, may be about 45 μm. A pitch of the bumps 96 may be about 90 μm, fanned out from the 20 μm pitch of the large semiconductor die 50.

Figure 3E:
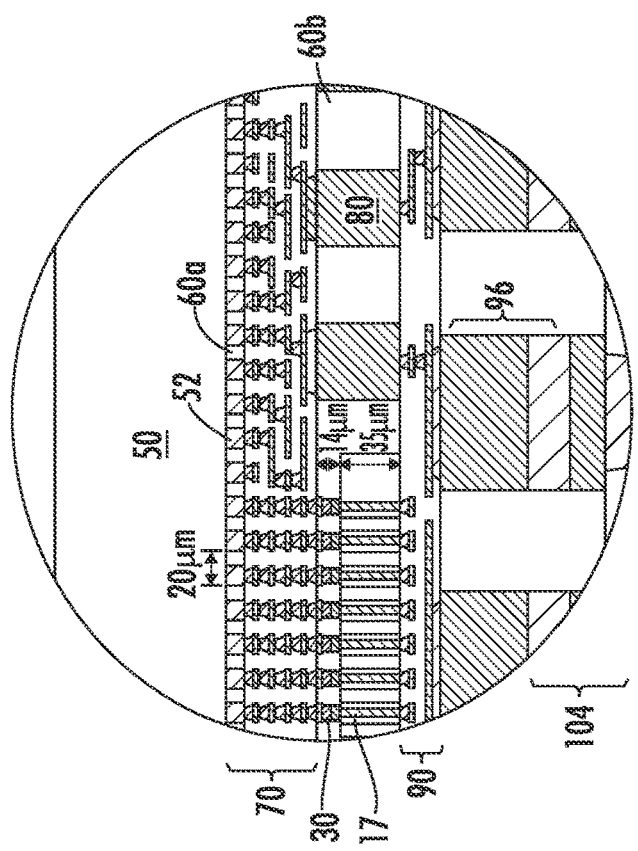
Figure 3D:
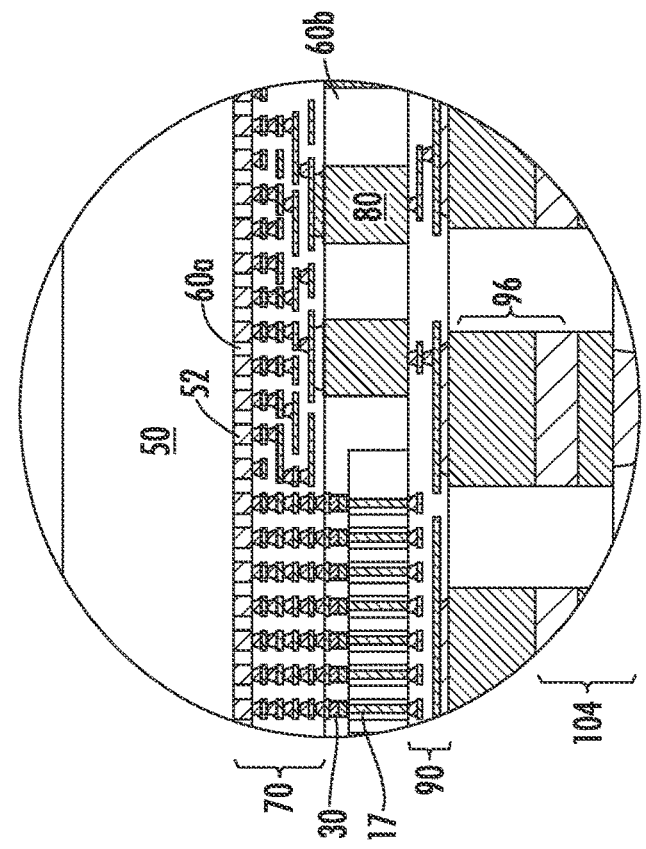

FIG. 3D illustrates a close-up profile view of the right side of FIG. 2N, showing embedded device 14 without solder or with solderless interconnects mounted to the build-up interconnect structure 70 and covered in encapsulant 60c. FIG. 3D differs from FIG. 2P by reversing or flipping the vertical orientation of the package, in keeping with the orientation of FIG. 3A, and further differs from FIG. 2P by the removal of the temporary carrier 40.

FIG. 3E illustrates the structure shown in FIG. 3D, but with exemplary dimensions that may be used in forming the semiconductor device 100. A pitch of the conductive interconnects 52 of the large semiconductor die 50 may be about 20 μm. A pitch of the TSVs 27 within the embedded device 14 may also be about 20 μm, and match or correspond to a pitch of the conductive interconnects 52. A height of the embedded device 14 may be about 35 μm. A height of the encapsulant 60b over the embedded device 14 and between the embedded device and the first build-up interconnect structure 70 may be about 14 μm. A diameter of the vertical conductive interconnects 80 may be about 45 μm. A height of the bumps 96, or a copper portion of the bumps 96, may be about 45 μm. A pitch of the bumps 96 may be about 90 μm, fanned out from the 20 μm pitch of the large semiconductor die 50.

While FIGS. 3A-3E show two different mounting approaches for embedded devices 14 that include with and without solder. Generally, a single approach of coupling embedded devices 14 will be used in a package, as will be appreciated by a POSA. The advantages shown and described herein, include the disparate elements of TSVs and encapsulant, which have not been previously brought together as described herein. Conventionally wafer fabrication technology (front end packaging) and post fab packaging (back-end packaging) have relied on separate, isolated, and differing practices. The bringing together of TSVs in an embedded device defies convention, breaks existing beliefs and paradigms, by bringing together different packaging processes into a new method, device, system, structure, and form. The current method and design broadens the idea that TSVS are strictly an integrated circuit (IC) technology, and challenges the notion that encapsulant or mold compound would not be used (as shown herein) in a wafer fab. To the contrary, the current semiconductor device is produced by fabrication inside the molded material or encapsulant, to provide an extension to the embedded device (chip). The new method and device advantageously provides relaxed pitch, such as for a BGA with a pitch >90 μm, so as to allow mass reflow and lower a cost for substrates. The new method and device further advantageously provide high density and small form factor while eliminating potential yield loss for system on chip (SoC) designs, included those associated with a chips first process.

As illustrated in FIG. 3D, signal routing from the large die 50 may be accomplished vertically from the large semiconductor die to the embedded die 14 without additional horizontal routing or displacement. In some instances, a pitch of the conductive interconnects 52 of the large semiconductor device 50 can match (or be the same or similar as) the pitch of the build-up interconnect structure 70, which can match (or be the same or similar as) the pitch of the embedded device 14 and the TSVs 27. An offset or vertical distance between the large semiconductor die 50 and the embedded device 14 can also be reduced by having the large semiconductor die 50 fully molded by encapsulant 60 or base layer 60a of encapsulant, with only the thin build-up interconnect structure 70 disposed between them, (such as without an interposer or additional stand-offs, posts, columns, bumps, or vertical interconnects. Additionally, a height or thickness of the build-up interconnect structure 70 may be in a range of about 20-50 μm. By controlling or reducing both the horizontal displacement and the vertical distance of signals and electrical routing between the large semiconductor die 50 and the TSVs of the embedded device 14, signals and electrical routing to the build-up interconnect structure 90 may be reduced, thereby reducing impedance, signal propagation time, or undesired inductance. In some instances, the performance, operating frequency, or power efficiency of the large semiconductor device is improved by the minimized electrical interconnect to the embedded device.

Figure 4A:
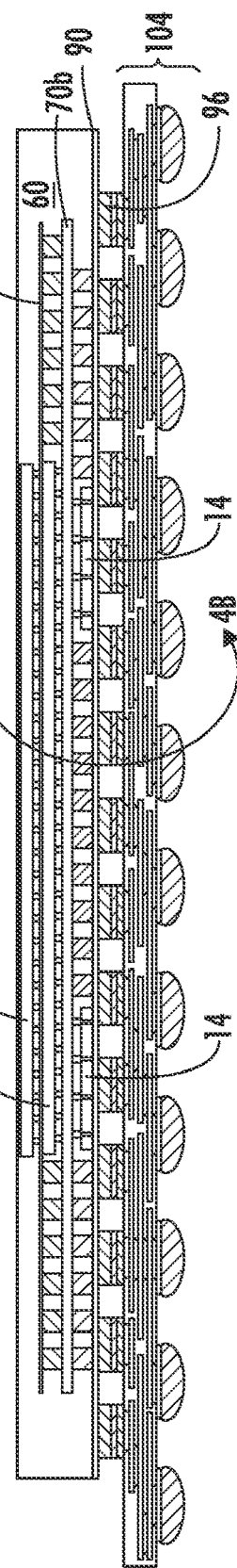
FIGS. 4A and 4B illustrate additional views of an aspect of the fully molded interposer module with multiple large semiconductor die.

FIG. 4A illustrates molded semiconductor device 110 that is similar to molded semiconductor device 100 of FIG. 3A. Molded semiconductor device 110, like molded semiconductor device 100, is further shown coupled to a PCB or substrate 104 with bumps 96. FIG. 4A differs from FIG. 3A in that there is more than one encapsulated large semiconductor die 50 encapsulated within the package that is electrically coupled with the build-up interconnect structures 70, 90 and TSV embedded devices 14. The structure of FIG. 4A may be formed by starting at the portion of the molded structure shown at the top of the figure and building up in one direction over a single carrier. A first large semiconductor die 50a may be encapsulated and then a first build-up interconnect structure 70a may be built over the first large semiconductor die 50a. A second large semiconductor die 50b may be disposed over the first large semiconductor die 50a and may be encapsulated and the second large semiconductor die 50b may be encapsulated and a second build-up interconnect structure 70b may then be built over the second large semiconductor die 50b. The subsequent structure, or additional layers, may be then built-up as described with respect to FIGS. 2D-2P and FIG. 3A. Alternatively, a same or similar structure may be formed by starting at the portion of the molded structure shown at the bottom of the figure.

Figure 4B:
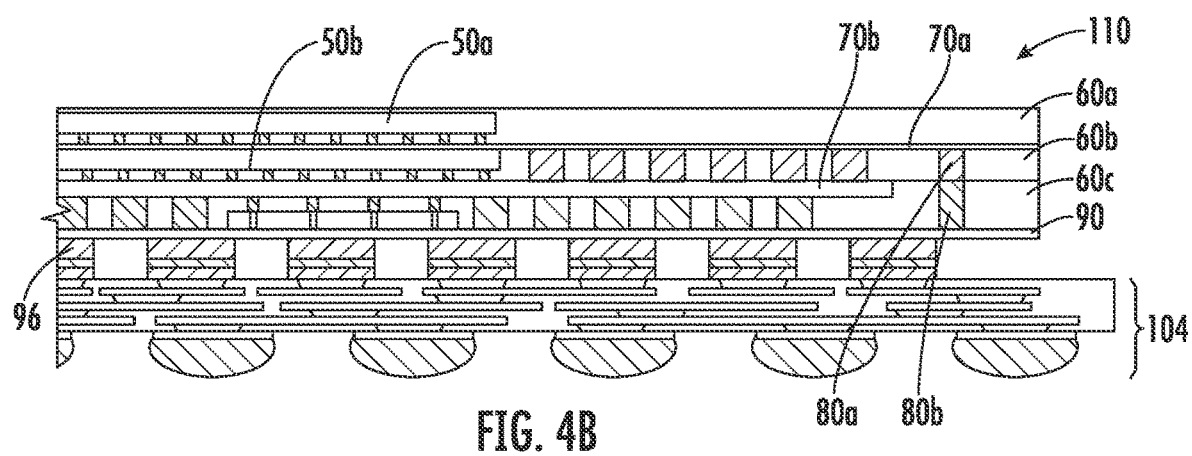

FIG. 4B illustrates an enlarged close-up view of the right side of the molded semiconductor device 110 from FIG. 4A, taken along the section line 4B. FIG. 4B also shows that layers of vertical conductive interconnects 80 may be stacked one over another, with or without an intervening build-up interconnect structure 70a being formed therebetween. Stated another way, a first layer of vertical conductive interconnects 80a may be stacked over a second layer of vertical conductive interconnects 80b.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A semiconductor device, comprising:
   a large semiconductor die comprising conductive interconnects with a first encapsulant disposed around four side surfaces of the large semiconductor die, over an active surface of the large semiconductor die, and around the conductive interconnects;
   a first build-up interconnect structure disposed over the large semiconductor die and over the first encapsulant;
   vertical conductive interconnects disposed over the first build-up interconnect structure and around an embedded device mount site;
   an embedded device disposed over the embedded device mount site and completely within a footprint of the large semiconductor die, wherein the embedded device comprises through silicon vias (TSVs), and wherein the embedded device further comprises an active device, a semiconductor die comprising an active surface, an integrated passive device (IPD), or a passive device;
   a single second encapsulant disposed over and contacting the first build-up interconnect structure, around the vertical conductive interconnects, and around and contacting at least five sides of the embedded device;
   a second build-up interconnect structure disposed over the second encapsulant and configured to be electrically coupled to the TSVs of the embedded device and the vertical conductive interconnects; and
   conductive bumps disposed over the second build-up interconnect structure and configured to couple the semiconductor device with other devices, wherein the conductive bumps comprise one or more of an input electrical contact, an output electrical contact, an i/o contact, a bump, a solder ball, a solder bump, a BGA, a LGA, land pads, copper pillars, and copper pillars with solder.

2. The semiconductor device of claim 1, further comprising a first large semiconductor die disposed over the large semiconductor die.

3. The semiconductor device of claim 1, wherein the embedded device is coupled to the first build-up interconnect structure with solder.

4. The semiconductor device of claim 1, wherein the embedded device is coupled to the first build-up interconnect structure with a solderless interconnect.

5. The semiconductor device of claim 1, further comprising a first layer of vertical conductive interconnects stacked over a second layer of vertical conductive interconnects.

6. A semiconductor device, comprising:
   a large semiconductor die comprising conductive interconnects with a first encapsulant disposed around four side surfaces of the large semiconductor die, over an active surface of the large semiconductor die, and around the conductive interconnects;
   a first build-up interconnect structure disposed over the large semiconductor die and over the first encapsulant;
   vertical conductive interconnects disposed over the first build-up interconnect structure and disposed around an embedded device mount site, wherein the embedded device mount site is completely within a footprint of the large semiconductor die;

an embedded device disposed over the embedded device mount site, wherein the embedded device comprises through silicon vias (TSVs);

a second encapsulant disposed over the first build-up interconnect structure, around the vertical conductive interconnects, and around and contacting at least five sides of the embedded device; and a second build-up interconnect structure disposed over the second encapsulant and configured to be electrically coupled to the TSVs of the embedded device and the vertical conductive interconnects.

7. The semiconductor device of claim 6, wherein the embedded device comprises an active device, a semiconductor die comprising an active surface, an integrated passive device (IPD), or a passive device.

8. The semiconductor device of claim 6, further comprising conductive bumps disposed over the second build-up interconnect structure and configured to couple the semiconductor device with other devices, wherein the conductive bumps comprise one or more of an input electrical contact, an output electrical contact, an i/o contact, a bump, a solder ball, a solder bump, a BGA, a LGA, land pads, copper pillars, and copper pillars with solder.

9. The semiconductor device of claim 6, further comprising a first large semiconductor die disposed over the large semiconductor die.

10. The semiconductor device of claim 6, wherein the embedded device is coupled to the first build-up interconnect structure with solder.

11. The semiconductor device of claim 6, wherein the embedded device is coupled to the first build-up interconnect structure with a solderless interconnect.

12. The semiconductor device of claim 6, further comprising a first layer of vertical conductive interconnects stacked over a second layer of vertical conductive interconnects.

13. A semiconductor device, comprising:
- a large semiconductor die comprising conductive interconnects with a first encapsulant disposed around four side surfaces of the large semiconductor die, over an active surface of the large semiconductor die, and around the conductive interconnects;
- a first build-up interconnect structure disposed over the large semiconductor die and over the first encapsulant;
- an embedded device comprising through silicon vias (TSVs) coupled with the large semiconductor die;
- a second encapsulant disposed over the first build-up interconnect structure, and around at least five sides of the embedded device; and
- a second build-up interconnect structure disposed over the second encapsulant and configured to be electrically coupled to the TSVs of the embedded device and the large semiconductor die.

14. The semiconductor device of claim 13, wherein the embedded device comprises an active device, a semiconductor die comprising an active surface, an integrated passive device (IPD), or a passive device.

15. The semiconductor device of claim 13, further comprising conductive bumps disposed over the second build-up interconnect structure and configured to couple the semiconductor device with other devices, wherein the conductive bumps comprise one or more of an input electrical contact, an output electrical contact, an i/o contact, a bump, a solder ball, a solder bump, a BGA, a LGA, land pads, copper pillars, and copper pillars with solder.

16. The semiconductor device of claim 13, further comprising a first large semiconductor die disposed over the large semiconductor die.

17. The semiconductor device of claim 13, wherein the embedded device is coupled to the first build-up interconnect structure with solder.

18. The semiconductor device of claim 13, wherein the embedded device is coupled to the first build-up interconnect structure with a solderless interconnect.

19. The semiconductor device of claim 13, further comprising vertical conductive interconnects disposed over the first build-up interconnect structure and coupled to the second build-up interconnect structure.

20. A semiconductor device, comprising:
- a large semiconductor die comprising conductive interconnects with a first encapsulant disposed around four side surfaces of the large semiconductor die, over an active surface of the large semiconductor die, and around the conductive interconnects;
- a first build-up interconnect structure disposed over the large semiconductor die and over the first encapsulant;
- an embedded device comprising through silicon vias (TSVs) coupled with the large semiconductor die;
- a second encapsulant disposed over the first build-up interconnect structure, and around at least five sides of the embedded device;
- a second build-up interconnect structure disposed over the second encapsulant and configured to be electrically coupled to the TSVs of the embedded device and the large semiconductor die;
- vertical conductive interconnects disposed over the first build-up interconnect structure and coupled to the second build-up interconnect structure; and
- a first layer of vertical conductive interconnects stacked over the vertical conductive interconnects.

* * * * *